United States Patent
Li

(10) Patent No.: US 10,720,933 B2
(45) Date of Patent: Jul. 21, 2020

(54) COMPARATOR ERROR SUPPRESSION

(71) Applicant: Analog Devices, Inc., Norwood, MA (US)

(72) Inventor: Hongxing Li, Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/801,963

(22) Filed: Nov. 2, 2017

(65) Prior Publication Data

US 2019/0131988 A1 May 2, 2019

(51) Int. Cl.
| | |
|---|---|
| *H03M 1/06* | (2006.01) |
| *H03M 1/08* | (2006.01) |
| *H03H 17/04* | (2006.01) |
| *H03K 5/22* | (2006.01) |
| *H03M 1/00* | (2006.01) |
| *H03M 1/46* | (2006.01) |

(52) U.S. Cl.
CPC .............. *H03M 1/08* (2013.01); *H03H 17/04* (2013.01); *H03K 5/22* (2013.01); *H03M 1/002* (2013.01); *H03M 1/0607* (2013.01); *H03M 1/468* (2013.01)

(58) Field of Classification Search
CPC ........ H03M 1/468; H03M 1/38; H03M 1/462; H03M 1/1009; H03M 1/466; H03M 1/002; H03M 1/12; H03M 1/804; H03M 1/1023; H03M 1/1061; H03M 1/1038; H03M 1/121; H03M 1/183
USPC .................................. 341/118, 120, 155, 172
See application file for complete search history.

(56) References Cited

U.S. PATENT DOCUMENTS

| | | | | |
|---|---|---|---|---|
| 5,053,770 | A * | 10/1991 | Mayer ..................... | H03F 1/304 341/118 |
| 6,826,390 | B1 * | 11/2004 | Tamura ............... | H03F 3/45183 375/346 |
| 7,218,259 | B2 | 5/2007 | Hurrell et al. | |
| 7,511,652 | B1 * | 3/2009 | Liu ........................ | H03K 5/24 341/120 |
| 9,071,261 | B2 | 6/2015 | Shen et al. | |
| 9,397,679 | B1 * | 7/2016 | Harpe ................. | H03M 1/1033 |
| 9,722,621 | B2 * | 8/2017 | Ranjbar ................. | H03M 1/38 |

(Continued)

OTHER PUBLICATIONS

Cao, Zhiheng, et al., "A 32 mW 1.25 GS/s 6b 2b/Step SAR ADC in 0.13 ??m CMOS", IEEE Journal of Solid-State Circuits, vol. 44, No. 3, (Mar. 2009), 862-873.

(Continued)

*Primary Examiner* — Linh V Nguyen
(74) *Attorney, Agent, or Firm* — Schwegman Lundberg & Woessner, P.A.

(57) ABSTRACT

Comparator input noise or offset suppression can include an error detector circuit that can operate in a feedback loop, such as during an autozero phase. The error detector circuit can include a time-varying filter response to improve accuracy and convergence time. The comparator can be used in a successive approximation routine (SAR) or other analog-to-digital converter (ADC) circuit, such as to control a digital-to-analog converter (DAC), such as can be used to adjust a tuning circuit within the comparator to compensate for noise or offset. The DAC can be combined with a DAC used for carrying out SAR bit-trials or bit decisions.

28 Claims, 17 Drawing Sheets

(56) References Cited

U.S. PATENT DOCUMENTS

| | | | |
|---|---|---|---|
| 2003/0001762 A1* | 1/2003 | Casper | H03F 3/45183 |
| | | | 341/118 |
| 2006/0244520 A1* | 11/2006 | Wang | H03F 3/45753 |
| | | | 330/9 |
| 2007/0252747 A1* | 11/2007 | Lyden | H03M 1/0641 |
| | | | 341/161 |
| 2009/0185639 A1* | 7/2009 | Han | H03M 1/1295 |
| | | | 375/319 |
| 2010/0079317 A1* | 4/2010 | Feddeler | H03M 1/1038 |
| | | | 341/120 |
| 2010/0328125 A1* | 12/2010 | Pagnanelli | H03M 3/468 |
| | | | 341/143 |
| 2011/0068862 A1* | 3/2011 | Komatsu | H03F 1/34 |
| | | | 330/69 |
| 2011/0215957 A1 | 9/2011 | Hummerston et al. | |
| 2011/0260899 A1* | 10/2011 | Snedeker | H03M 1/1047 |
| | | | 341/118 |
| 2014/0070784 A1* | 3/2014 | Lynch | H02M 3/156 |
| | | | 323/283 |
| 2014/0132232 A1* | 5/2014 | MacLean | G05F 1/62 |
| | | | 323/271 |
| 2015/0061904 A1* | 3/2015 | Lee | H03M 1/1023 |
| | | | 341/118 |
| 2015/0263755 A1* | 9/2015 | Confalonieri | H03M 1/1019 |
| | | | 341/120 |
| 2015/0263756 A1* | 9/2015 | Chiu | H03M 1/468 |
| | | | 341/118 |
| 2016/0134300 A1* | 5/2016 | Wang | H03M 1/0854 |
| | | | 341/172 |
| 2016/0245912 A1* | 8/2016 | Smith | G01S 13/89 |
| 2016/0248435 A1* | 8/2016 | Harpe | H03M 1/1033 |
| 2017/0134034 A1* | 5/2017 | Ranjbar | H03M 1/38 |
| 2017/0302288 A1* | 10/2017 | Huang | H03M 1/1061 |

OTHER PUBLICATIONS

Opris, I. E., "Noise estimation in strobed comparators", Electronics Letters, vol. 33, No. 15, (Jul. 17, 1997), 1273-1274.

\* cited by examiner

COMPARATOR ERROR SUPPRESSION

TECHNICAL FIELD

This document pertains generally, but not by way of limitation, to integrated circuits, and more particularly, but not by way of limitation, to comparator error suppression.

BACKGROUND

Low power integrated circuits are desirable for various applications, such as for the "Internet of Things," (or "IoT"), which can involve distributed sensors and circuits, some of which may be battery-powered. Analog-to-digital conversion (ADC) can face challenges in being adapted to low power applications. Comparators used in such circuits can be limited by input noise or offset, such as can be present due to the input transistors of the comparator or due to variations in a power supply used to provide a power supply voltage to the comparator.

SUMMARY

The present inventor has recognized, among other things, that successive approximation routine (SAR) or other ADCs for low-power applications such as IoT can be challenged by their use of power-hungry comparator circuits. While a dynamic comparator circuit can be turned off between comparisons to reduce power, certain auto-zeroing techniques to reduce or minimize comparator noise or offset can face challenges when applied to such a dynamic comparator circuit that is turned off between comparisons.

To help address this and other problems, the present document describes, among other things, examples of systems and methods for making a comparison capable of compensating at least one of noise or offset. An error detector circuit can include an input that is connected to an output of a comparator circuit. The error detector circuit can include a filter circuit, such as with a dynamic, time-varying filter response, which can be responsive to multiple signal values of the comparator output. The error detector circuit can produce an output that can be used to tune the comparator circuit, such as to help reduce at least one of noise or offset. In an example, the error detector circuit can operate during an auto-zero mode of the comparator, during which the comparator inputs are effectively connected to the same signal voltage. In another example, the error detector circuit can operate on a residue left after one or more bit trials of a digital-to-analog converter (DAC) circuit that is coupled to the comparator input. Both examples are explained in more detail below. Both examples can optionally be used with a dynamic comparator circuit that can be turned off between comparisons, to address particular challenges in that context, or can be used with a comparator circuit that need not be turned off between comparisons.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present document describes, among other things, examples of systems and methods for making a comparison capable of compensating at least one of noise or offset. An error detector circuit can include an input that is connected to an output of a comparator circuit. The error detector circuit can include a filter circuit, such as with a dynamic, time-varying filter response, which can be responsive to multiple signal values of the comparator output. The error detector circuit can produce an output that can be used to tune the comparator circuit, such as to help reduce at least one of noise or offset. In an example, the error detector circuit can operate during an auto-zero mode of the comparator, during which the comparator inputs are effectively connected to the same signal voltage. In another example, the error detector circuit can operate on a residue left after one or more bit trials of a digital-to-analog converter (DAC) circuit that is coupled to the comparator input. Both examples are explained in more detail below. Both examples can optionally be used with a dynamic comparator circuit that can be turned off between comparisons, to address particular challenges in that context, or can be used with a comparator circuit that need not be turned off between comparisons.

Figure 1A:
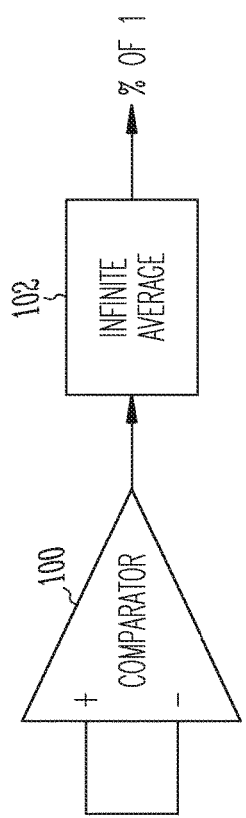
FIG. 1A shows an illustrative example of a comparator circuit during an auto-zero phase of operation, when the comparator inputs are effectively electrically connected together to the same input voltage.
Figure 1B:
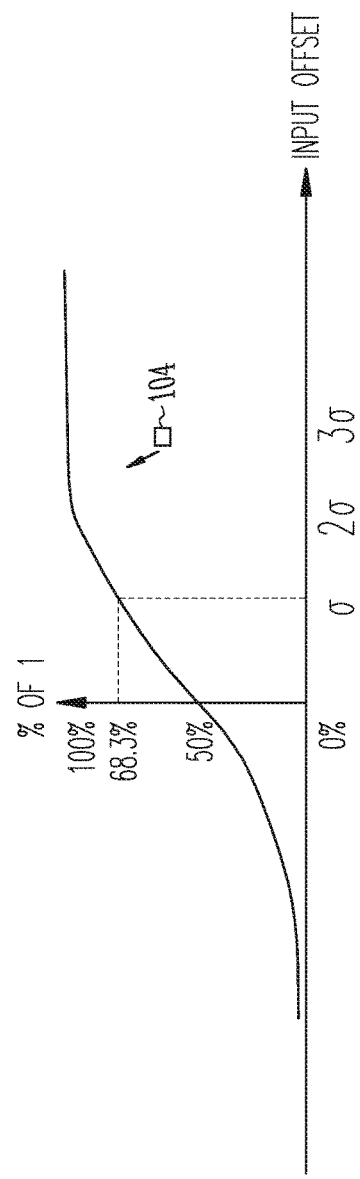
FIG. 1B shows an illustrative example of a graph of input offset vs. comparison percent of "1." results, assuming a Gaussian distribution of results.

FIG. 1A shows an illustrative example of a comparator 100 circuit during an auto-zero phase of operation, when the comparator inputs of the comparator 100 are effectively electrically connected together to the same input voltage. A comparator output of the comparator 100 can be electrically coupled to provide a comparator output signal to an input of an averager 102 or other accumulator-type circuit. For a comparator 100—without any noise or offset—as the number of comparisons grows large (e.g., approaches an average of an "infinite" number of samples), the number of comparisons yielding an output binary comparison signal value of "1" should equal the number of comparisons yielding an output binary comparison signal value of "0" at the comparator output. In such a case, 50% of the comparisons yield an output of "1" and 50% of comparisons yield an output of "0", such as shown in the graph 104 of input offset vs. comparison percent of "1" results, in FIG. 1B, which assumes a Gaussian distribution of results. The actual percentage of "1" results obtained over an infinite (or large enough) number of comparisons can provide an indication of the input offset voltage of the comparator 100, at least as a portion of the total comparator input noise, which can vary as a function of temperature.

Figure 2:
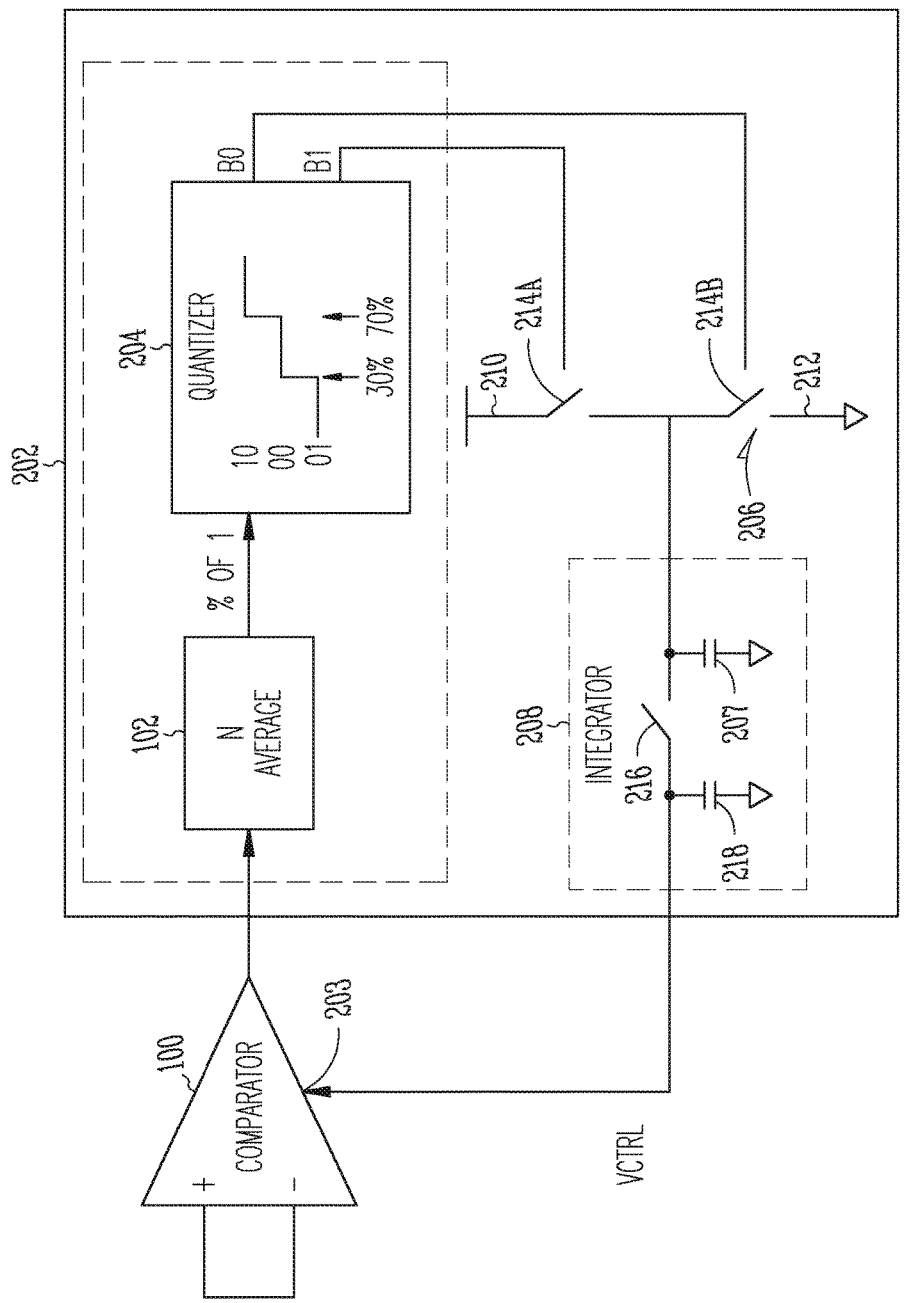
FIG. 2 shows an example of the comparator with an error detector circuit having an error detector input that can be electrically coupled to the output of the comparator, and having an error detector output that can be electrically coupled to a compensation input of the comparator.
Figure 12:
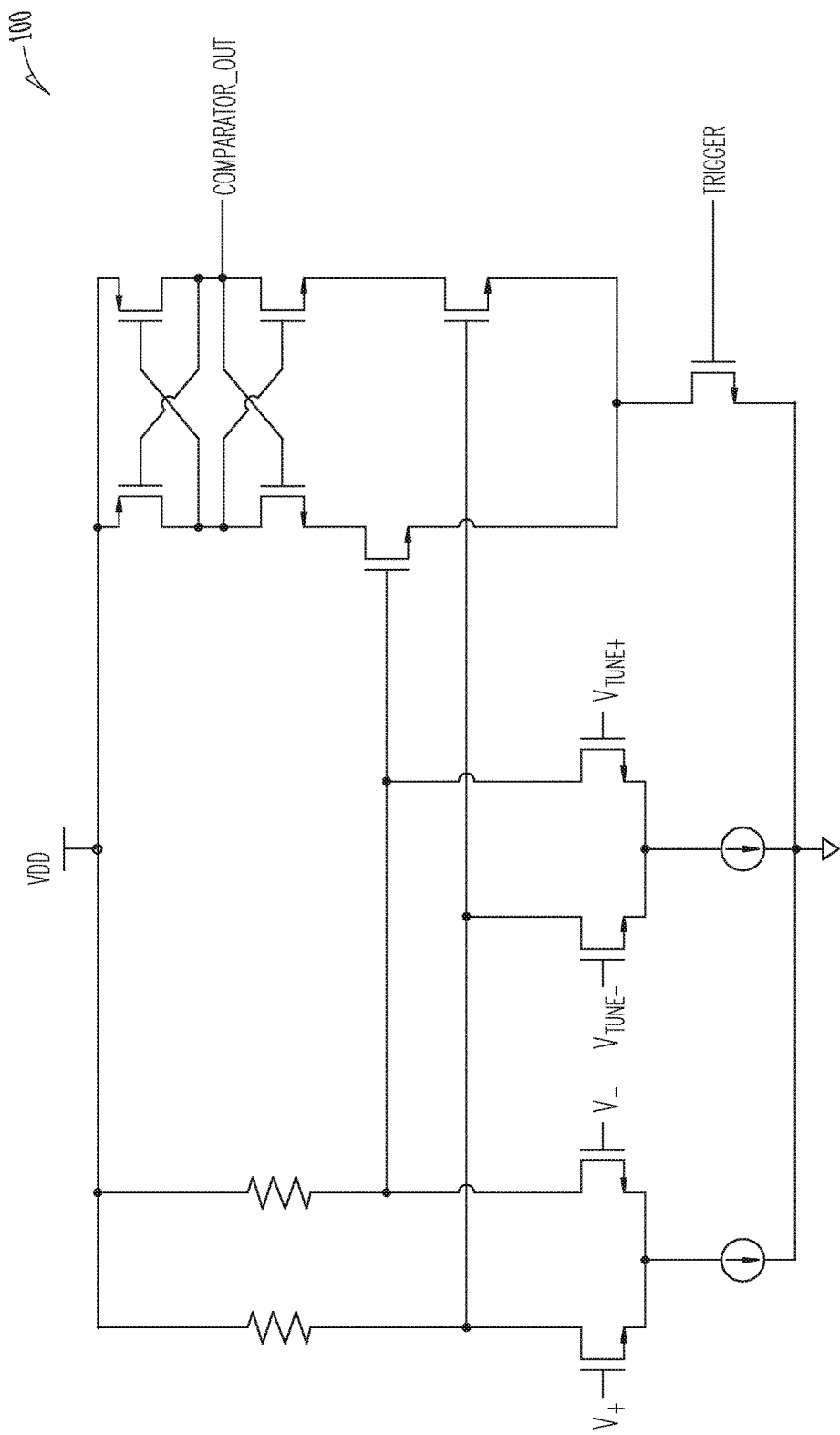
FIG. 12 shows a more detailed example of a comparator that can include tunable noise or offset compensation inputs.

FIG. 2 shows an example of the comparator 100 with an error detector circuit 202 having an error detector input that can be electrically coupled to the output of the comparator 100. An error detector output of the error detector circuit 202 can be electrically coupled to a compensation input 203 of the comparator 100. An example of a comparator 100 with compensation inputs is shown in FIG. 12. This can be used to apply an offset or noise compensation signal to the comparator 100, such as to correct an offset or noise of the comparator 100. The error detector circuit 202 can include an averager 102, which, in practice, can be implemented as an average of "N" samples of the output of the comparator 100. The number "N" of samples can be large enough to provide a stable and statistically representative indication at the output of the averager 102 of the percentage of "1" results (or, alternatively, the percentage of "0" results) being provided at the output of the comparator 100, rather than an "infinite" number of samples, such as explained with respect to FIGS. 1A and 1B. For example, N can equal 10 samples, 30 samples, 100 samples, 1000 samples, or some other number of samples that is statistically sufficient.

A quantizer 204 circuit can include a quantizer input that can be electrically coupled to the output of the averager circuit 102, such as to classify or categorize the percentage of "1" results into bins. For example, for a two-bit quantizer 204, such as shown, the percentage of "1" results can be assigned to one of the following two-bit $B_0B_1$ codes: 00, 01, and 10. These codes (e.g., B0 and B1) can be provided at a quantizer output of the quantizer 204. For example, the quantizer output can include a bus providing separate lines B0 and B1.

An error modulator 206 circuit can include an error modulator input to receive the quantizer output, such as for use in determining whether to selectively couple a correction charge capacitor 207 of an integrator 208 to a first control reference voltage (e.g., VDD) at node 210 or to a second control reference voltage (e.g., VSS) at node 212, such as via respective switches 214A-B being controlled by the separate lines B0 and B1 of the quantizer output of the quantizer 204. The incremental correction charge on the correction charge capacitor 207 can then be selectively coupled, such as via an integration switch 216, onto an integration capacitor 218 of the integrator 108, such as after the switches 214A-B of the error modulator 206 have been opened. The stored voltage on the integration capacitor 218 can be provided at the output of the integrator 208, such as for being electrically coupled and provided to the error compensation input 203 of the comparator 100.

In operation, for example, when the averaged percentage of "1" results of the comparator is in the 30%-70% range ($B_0B_1$=00), no incremental charge is added to or subtracted from the integration capacitor 218 via the error modulator 206 and the incremental charge capacitor 207. When the averaged percentage of "1" results of the comparator is outside of the 30%-70% range, such as in the above 70% range, ($B_0B_1$=10) the error modulator can add an incremental charge to the integration capacitor 218 via the error modulator 206 and the incremental charge capacitor 207. When the averaged percentage of "1" results of the comparator is outside of the 30%-70% range, such as in the below 30% range, ($B_0B_1$=01) the error modulator can subtract an incremental charge from the integration capacitor 218 via the error modulator 206 and the incremental charge capacitor 207. In this example, this digital control loop for error correction of the comparator 100 has only one pole, and can be made unconditionally stable, while limiting the frequency at which the comparator compensation input 203 is adjusted such as by adding or subtracting an incremental charge from the integration capacitor 218 of the integrator 208.

In the example shown in FIG. 2, the quantizer levels can be established as desired, such as to correspond to a specified noise characteristic of the comparator 100, such as can be determined experimentally, by computer simulation, or otherwise. One challenge that can be faced by the implementation shown in the example of FIG. 2 is that the integrator 208 may have to be large in integrated circuit area, such as may be needed to implement the desired value of the integration capacitor 218. As shown in the example of FIG. 2, the integrator 208 is represented by capacitors 207 and 218 and the switch 216, however, other components may also be included, such as an active integration amplifier circuit, other switches, supporting circuitry, or the like, which details are not shown in FIG. 2 to enhance conceptual clarity of the implementation shown in FIG. 2. In an example, the integrator 208 can be implemented as a digital integrator, instead of an analog integrator.

Figure 3A:
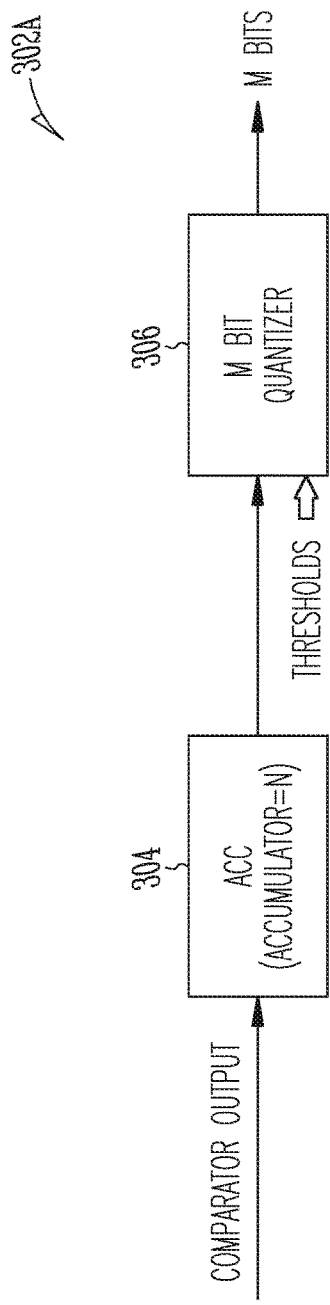
FIGS. 3A, 3B, and 3C show examples of portions of error detector circuits, such as can be used instead of portions of the error detector circuit shown in FIG. 2.
Figure 3B:
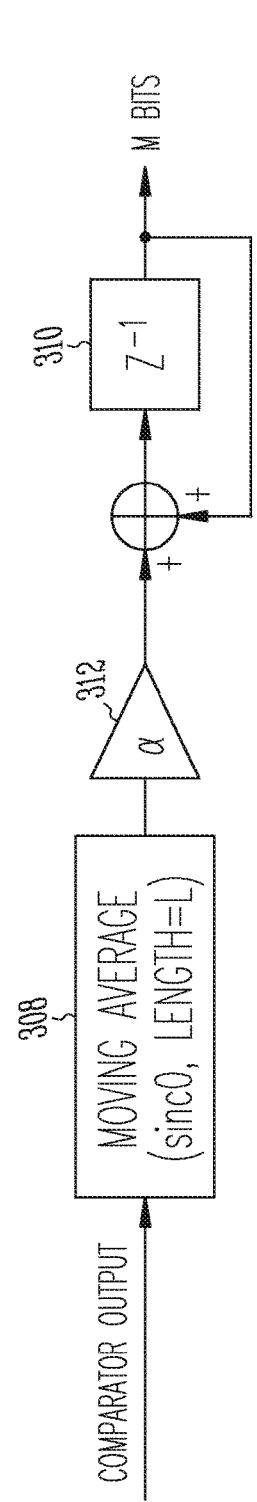
Figure 3C:
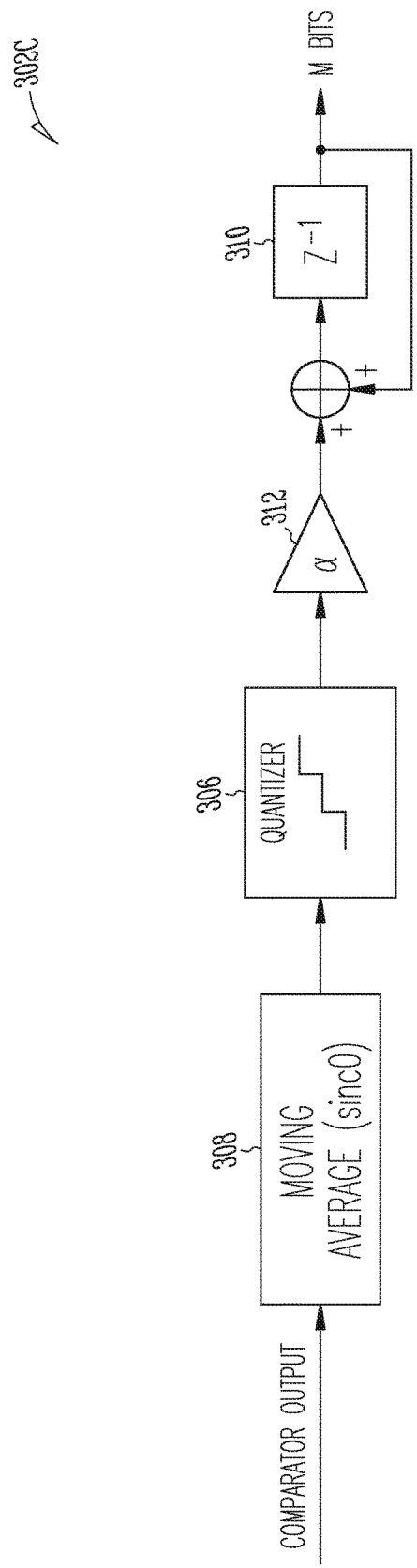

FIGS. 3A, 3B, and 3C show examples of portions of error detector circuits 302A, 302B, and 302C, such as can be used instead of portions of the error detector circuit 202, such as to avoid the need for an analog integrator 208 needing a large-area integration capacitor 218, or for meeting one or more other performance objectives. In these examples, the error detector circuits 302A, 302B, and 302C can be used to provide an M-bit error correction signal, which, in an example, can be applied to control a digital-to-analog converter (DAC) circuit for generating an analog input signal to apply to the comparator error compensation input 203. In a SAR. ADC circuit, for example, such DAC circuitry may already be available for applying the error compensation signal to the comparator error compensation input 203, such that additional integrated circuit area need not be required for such DAC circuitry.

FIG. 3A shows an example in which the error detector circuit 302A can include a finite impulse response (FIR) error detector. This can include an accumulator 304 circuit, such as can have an accumulator input arranged to receive and accumulate a window of N comparison results of the output of the comparator 100 before proceeding to accumulate the next window of the next N comparison results. The accumulator 304 can provide an accumulator output to an input of an M-bit quantizer 306 circuit, which can classify the result into bins that can be represented by M-bits, such as in a similar manner to that explained above. For example, the quantizer 306 can include one or more programmable thresholds such as can be pre-distorted, such as to match a Gaussian or other expected or measured noise profile of the comparator 100. Because the accumulator 304 accumulates a finite number N of samples, the M-bit quantizer output will not be noise free. The M-bits can be provided as an input to a DAC, such as can provide a DAC output signal for applying a compensation signal to one or more compensation inputs of the comparator 100.

FIG. 3B shows an example in which the error detector circuit 302B can include an infinite impulse response (IIR) filter, such as for integrating an error signal based on comparison results of the output of the comparator 100. A resulting M-bit signal can be provided to an input of a DAC, such as for providing a DAC output signal for applying a compensation signal to one or more compensation inputs of the comparator 100. For example, the error detector circuit 302B can include an averager or other accumulator 308, such as can provide a moving average (e.g., a sinc 0 filter of length L) of L comparison results of the output of the comparator 100. This accumulated value output by the accumulator 308 can be provided to an BR filter 310, such as through an optional adjustable gain stage 312, which can provide an integrator gain of α. The gain stage 312 can optionally be combined into the IIR filter 310, if desired. The IIR filter 310 can provide an M-bit output, which, in turn, can be provided to an input of a DAC, such as for providing a DAC output for applying a compensation signal to one or more compensation inputs of the comparator 100.

FIG. 3C shows an example that can be conceptualized as a combination of the approaches of FIGS. 3A and 3B. In the example of FIG. 3C, the error detector circuit 302C can include both a quantizer 306 and an IIR filter 310. The error detector circuit 302C can integrate an error signal based on comparison results of the output of the comparator 100 and can provide a resulting M-bit signal to an input of a DAC. An output of the DAC can be used to apply a compensation signal to one or more compensation inputs of the comparator 100. The error detector circuit 302C can include an averager or other accumulator 308. For example, the accumulator 308 can provide a moving average (e.g., a sinc 0 filter of length L) of L comparison results of the output of the comparator 100. The accumulated value output by the accumulator 308 can be provided to quantizer 306, such as for providing an M-bit quantized output, which, in turn, can be provided to an IIR filter 310, such as through an optional adjustable gain stage 312, which can provide an integrator gain of α. The gain stage 312 can optionally be combined into the IIR filter 310, if desired. The IIR filter 310 can provide an M-bit output, which, in turn, can be provided to a DAC, such as for applying a compensation signal to one or more compensation inputs of the comparator 100.

Figure 4A:
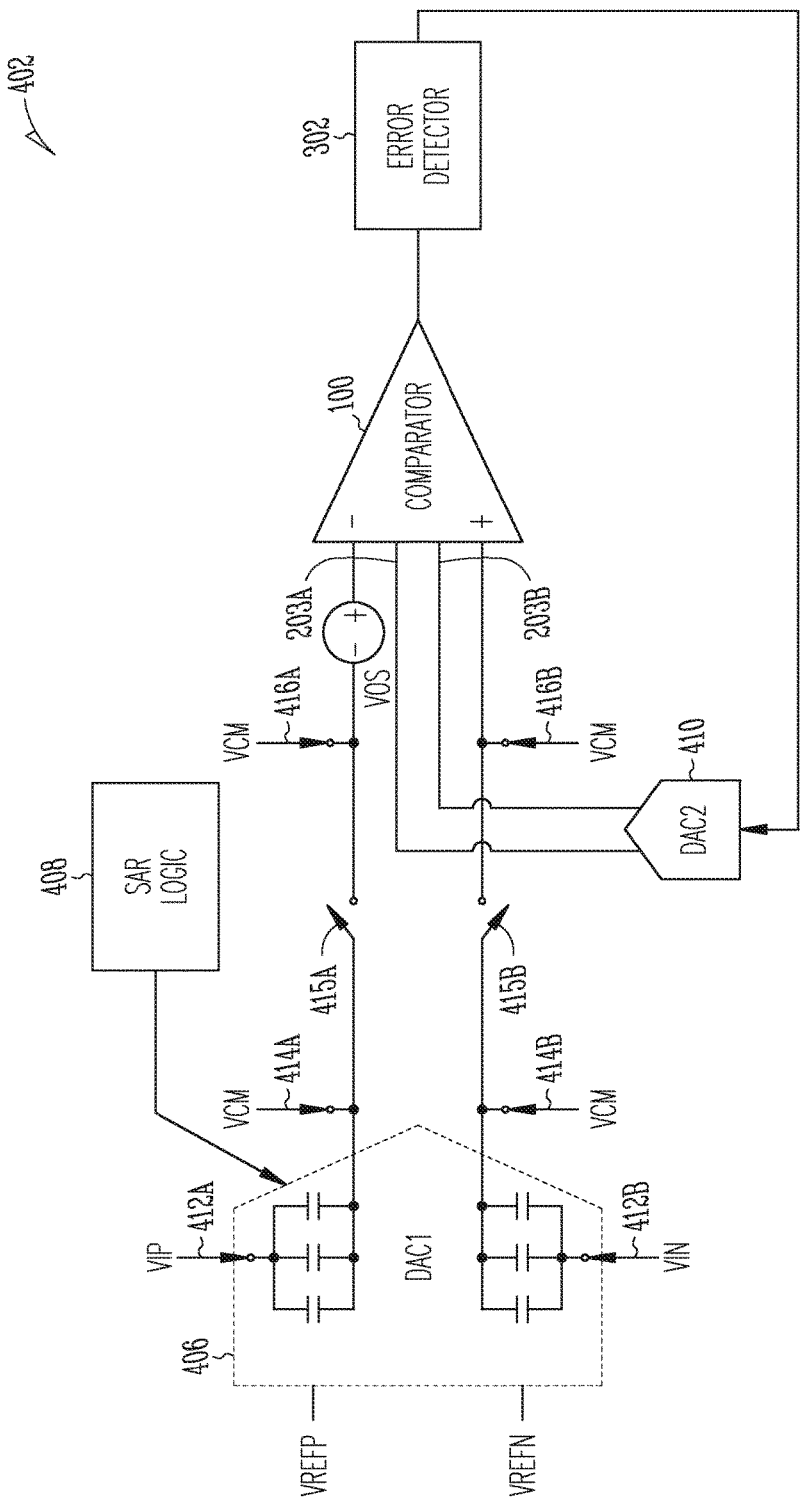
FIGS. 4A (signal acquisition phase), 4B (auto-zero phase), and 4C (bit trial or bit decision phase) show an example in which an error detector (e.g., such as any of the error detectors shown in FIG. 3A, 3B, or 3C) can be used in combination with a SAR ADC.

FIGS. 4A (signal acquisition phase), 4B (auto-zero phase), and 4C (bit trial or bit decision phase) show an example in which an error detector 302 (e.g., such as any of the error detectors 302A, 302B, 302C) can be used in combination with a SAR ADC 402. The SAR ADC 402 can include a comparator 100 circuit and a first DAC circuit that can include a first DAC capacitor array DAC1 406 and associated switches and SAR logic circuitry 408. The error detector 302 can be used to provide an output to and control operation of a second DAC circuit that can include a second DAC capacitor array DAC2 410 and associated switches and control logic circuitry. The second DAC capacitor array DAC2 410 can be controlled by the error detector 302 for providing offset or noise correction control signals to respective differential error compensation inputs 203A-B of the comparator 100. The second DAC capacitor array DAC2 410 can be used to drive tuning circuitry inside the comparator 100, such as explained herein. Such tuning circuitry can be used to compensate a comparator input-referred offset or noise voltage, which is conceptually represented by the voltage source "vos" in the illustrations shown in FIGS. 4A-C.

In FIG. 4A, during the signal acquisition phase, switches 412A-B can be closed to selectively couple DAC1 406 to receive a differential input signal at differential inputs "vip", "vin". Concurrently during such signal acquisition phase, switches 414A-B can be in a closed state, such as to selectively couple and hold the respective "top" plates of the capacitor array DAC' 406 at a common mode reference voltage "vcm". The switches 412A-B shown in FIG. 4A can represent individual switches such as can be arranged to individually selectively couple selected individual "bottom" plates of capacitors in the capacitor array DAC1 406 to respective differential signal inputs "vip", "vin" during the signal acquisition phase shown in FIG. 4A, such as under control of the SAR logic circuitry 408.

In this example, switches 415A-B can be maintained in an open state during the signal acquisition phase of FIG. 4A, such as to isolate the capacitor array DAC1 406 from inputs of the comparator 100, such as while the inputs of the comparator 100 are held at a common mode reference voltage "vcm", such as by closing the switches 416A-B. During the signal acquisition phase shown in FIG. 4A, the error compensation DAC2 410 can be set to a specified value by the error detector 302, where such specified value during this signal acquisition phase need not reflect the error compensation value being used to compensate the comparator input-referred offset or noise voltage.

Figure 4B:
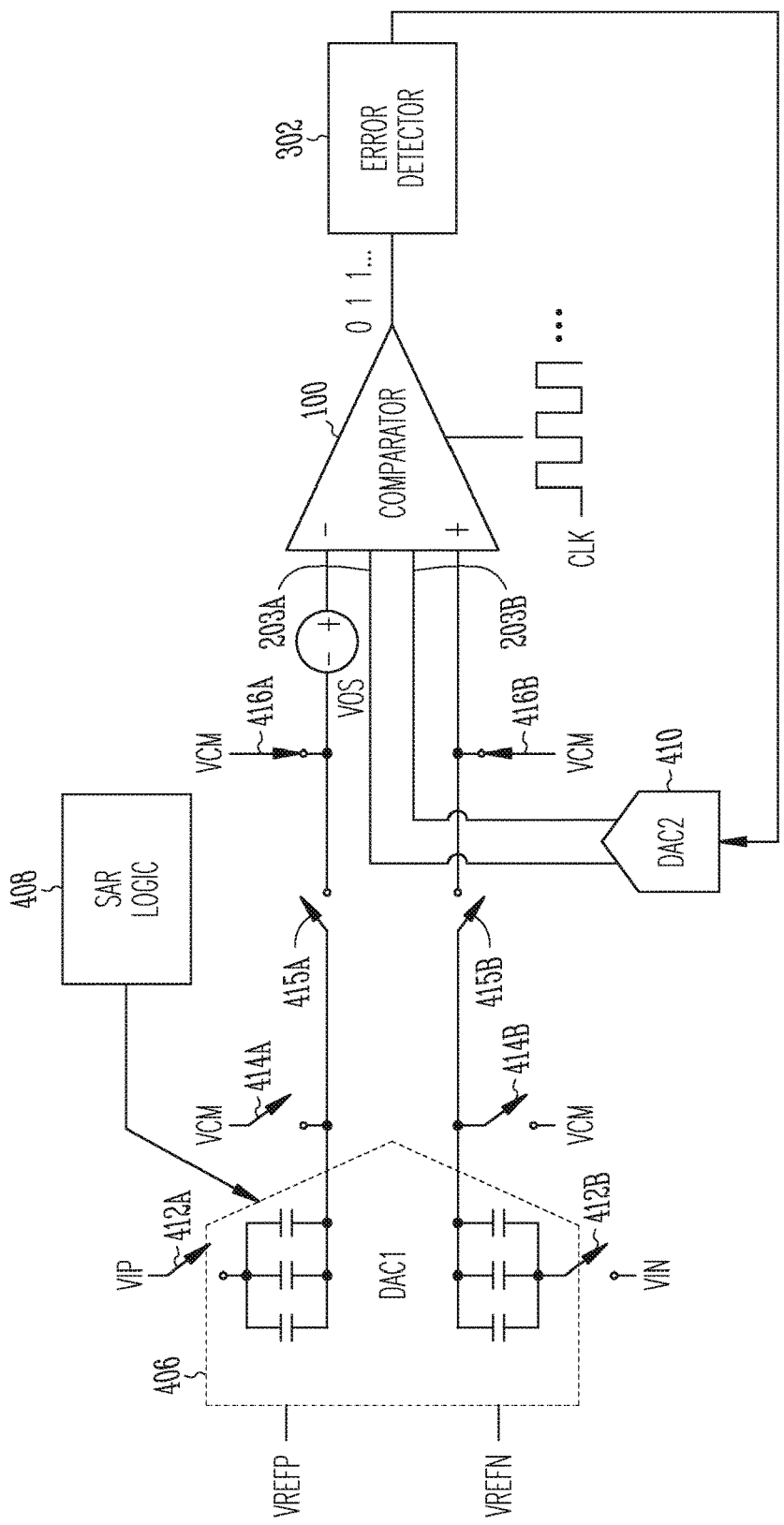

In FIG. 4B, during an auto-zero phase that can follow the signal acquisition phase, the DAC1 capacitor array 406A can complete its sampling, such as by opening switches 412A-B and 414A-B, or the DAC1 capacitor array 406A can optionally be operated to continue its sampling during this auto-zero phase, such as by maintaining a closed state of switches 412A-B and 414A-B, such as where a longer sampling period is desired. During the auto-zero phase, the switches 415A-B can remain open, such as to isolate the capacitor array DAC1 406 from inputs of the comparator 100. The comparator 100 can be operated by control circuitry within the error detector 302 such as to make multiple comparisons during the auto-zero phase, thereby yielding a series of multiple decision results. The multiple decision results can be provided via an output signal from the comparator 100, which can be provided as an input to the error detector 302, which can operate such as described above. The output of the error detector 302 can be provided to the error compensation DAC2 410, the output of which can be used to compensate the comparator 100, such as via the differential error compensation inputs 203A-B of the comparator 100. The control loop including the error detector 302 can be used to control DAC2 such that the comparator 100 produces roughly equal amounts of "1" and "0" results during the multiple comparisons performed by the comparator 100 during the auto-zero phase shown in FIG. 4B.

Figure 4C:
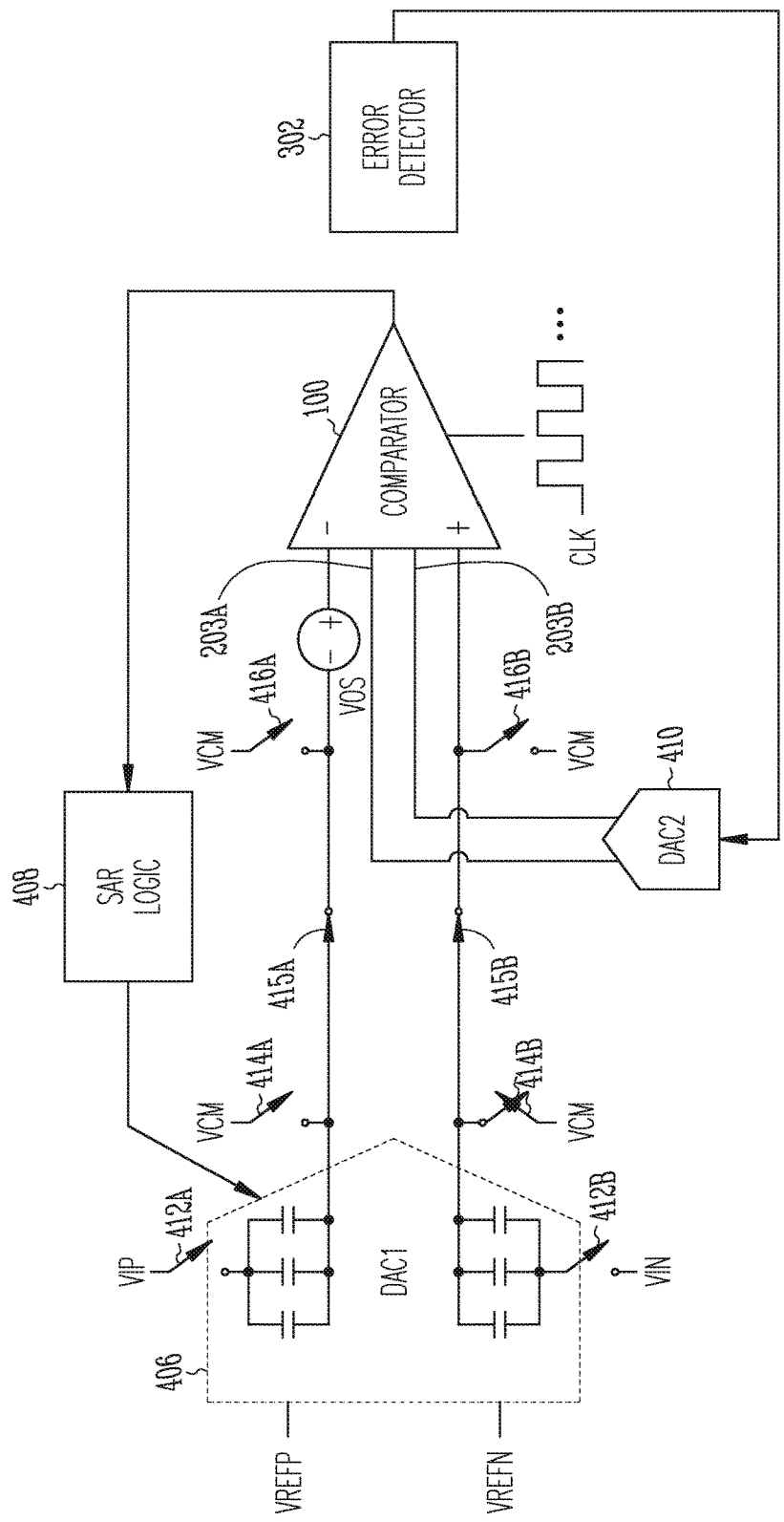

In FIG. 4C, during a bit-trial or bit-decision phase that can follow the signal acquisition phase, the DAC2 410 can maintain its error compensation value that was determined during the auto-zero phase, while the signal that was previously sampled onto DAC1 406 can undergo hit trials controlled by the SAR logic circuitry 408 for using the output of the comparator 100 for determining bits of a digital signal value corresponding to the sampled differential analog input signal. During this phase, the output of the comparator 100 need not be used by the error detector circuit 302. Also, during this bit-trial or bit-decision phase, the comparator 100 can be compensated by DAC2 such as using the control signals for DAC2 that were determined by the error detector 302 during the preceding auto-zero phase.

Operation can repeatedly cycle through the signal acquisition phase shown in FIG. 4A, the auto-zero phase shown in FIG. 4B, and then the bit-trial or bit decision phase shown in FIG. 4C. If desired, the auto-zero phase can be performed less often, such as intermittently, rather than together with each signal acquisition and bit-trial/decision cycle. Such an intermittent approach can improve SAR conversion speed, while preserving the accuracy provided using the input noise or offset compensation of the comparator 100 using the error detector 302, because the input noise or offset of the comparator 100 will generally vary at a lower frequency than the SAR conversion frequency. The auto-zero phase frequency can be fixed or dynamically adjusted accordingly.

Figure 5:
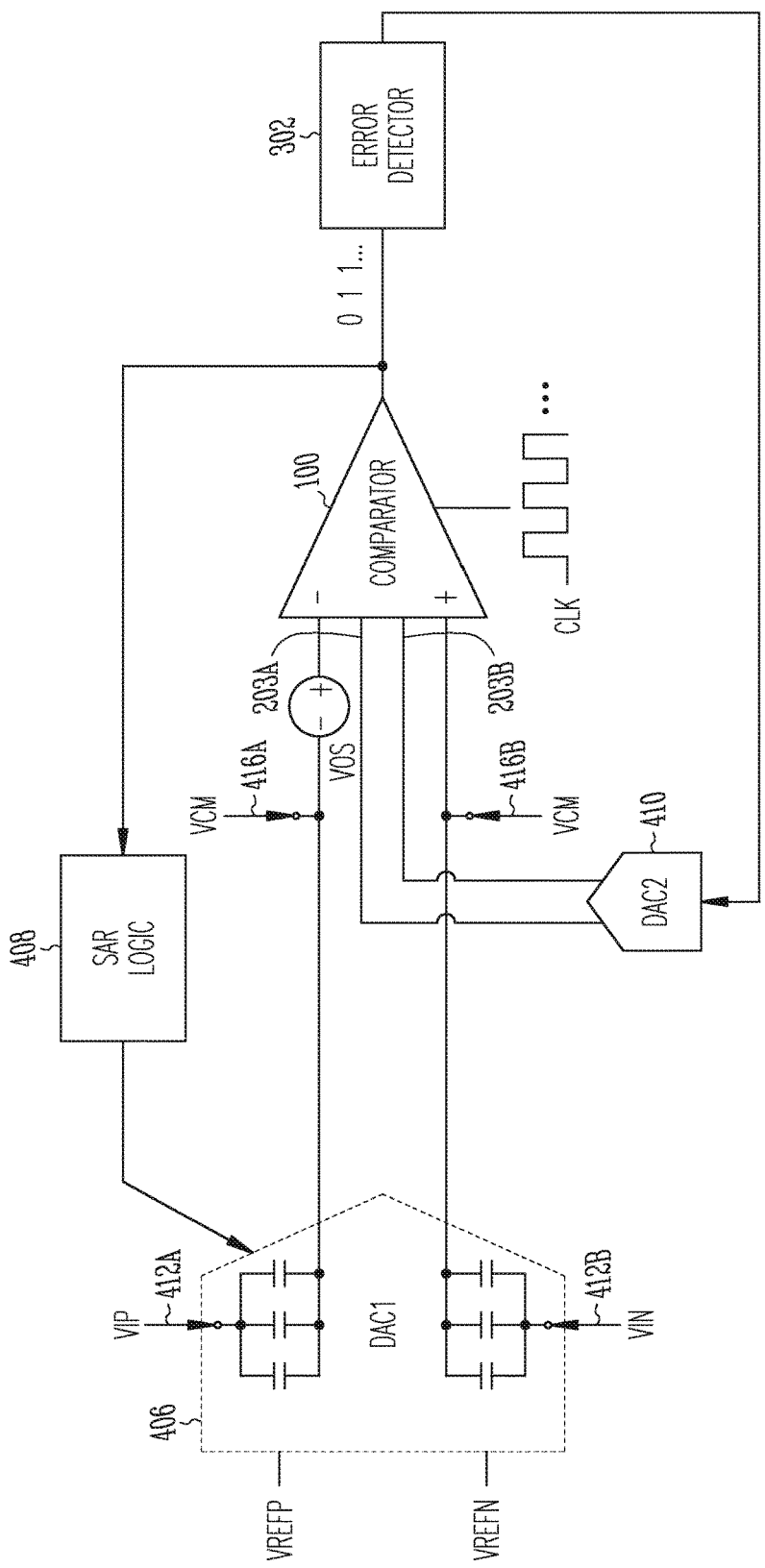
FIG. 5 shows another example, similar to that shown in FIGS. 4A, 4B, and 4B, but in which certain switches can be omitted, if desired.

FIG. 5 shows another example, similar to that shown in FIGS. 4A, 4B, and 4B, but in which the switches 414A-B and 415A-B can be omitted, if desired. During the signal acquisition phase, the switches 412A-B and 416A-B can be closed for sampling the input signal of interest onto the DAC1 406. During the auto-zero phase, the switches 416A-B can remain closed, while the switches 412A-B can be either open or closed, depending on whether input signal sampling is intended to continue during the auto-zero phase. During the auto-zero phase, the error detector 302 can operate in the loop shown in FIG. 5 such that multiple comparisons performed by the comparator 100 can be used to adjust the value provided by DAC2 until roughly equal amounts of "1" and "0" results are obtained during the auto-zero phase. The resulting error compensation value determined during the auto-zero phase can then be provided by DAC2 to control the differential error compensation inputs 203A-B of the comparator 100 during one or more subsequent bit-trial or bit-decision phases of operating the SAR ADC using DAC1 and SAR logic 408.

Figure 6A:
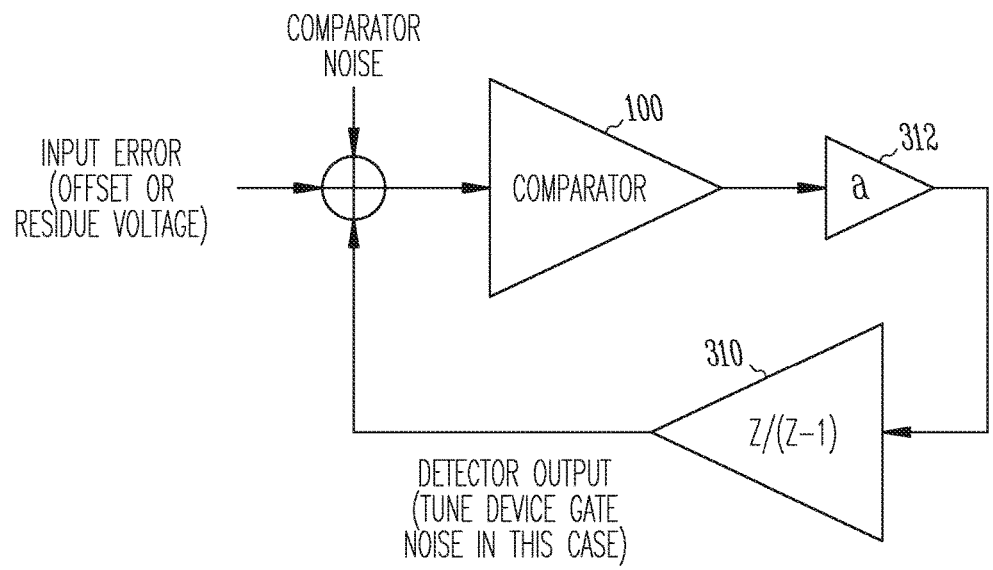
FIG. 6A shows a simplified block diagram showing portions of the control loop using the error detector circuit such as explained above.
Figure 6B:
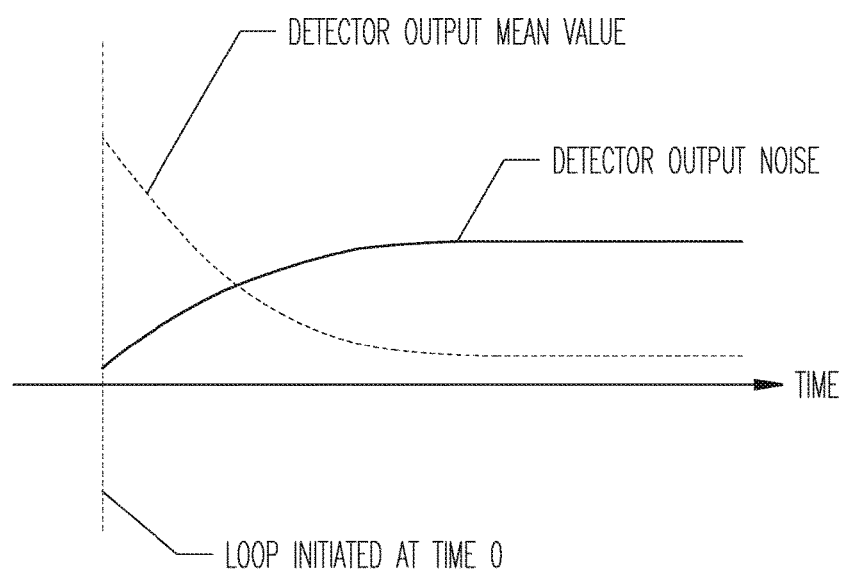
FIG. 6B shows a conceptualized graph of signal voltage vs. time, corresponding to the block diagram of FIG. 6A, during an auto-zero phase initiated at time t=0.

FIG. 6A shows a simplified block diagram showing portions of the control loop using the error detector circuit 302, e.g., such as using a gain stage 312 and an IIR filter 310 (or FIR or other filter), such as explained above. FIG. 69 shows a corresponding graph of signal voltage vs. time during an auto-zero phase as the multiple comparator output values of the comparator 100 are provided to the error detector circuit 302, after the auto-zero phase control loop has been initiated at time t=0 and while the auto-zero phase control loop such as shown in FIG. 6A is active. As shown conceptually in FIG. 6B, as the detector output mean signal value of the error detector circuit 302 gradually decreases over time during the auto-zero phase, a detector output noise of the error detector circuit 302 increases toward an asymptotic value. This detector output noise contribution of the error detector circuit 302 limits any further benefit of continuing the auto-zero phase.

Figure 7A:
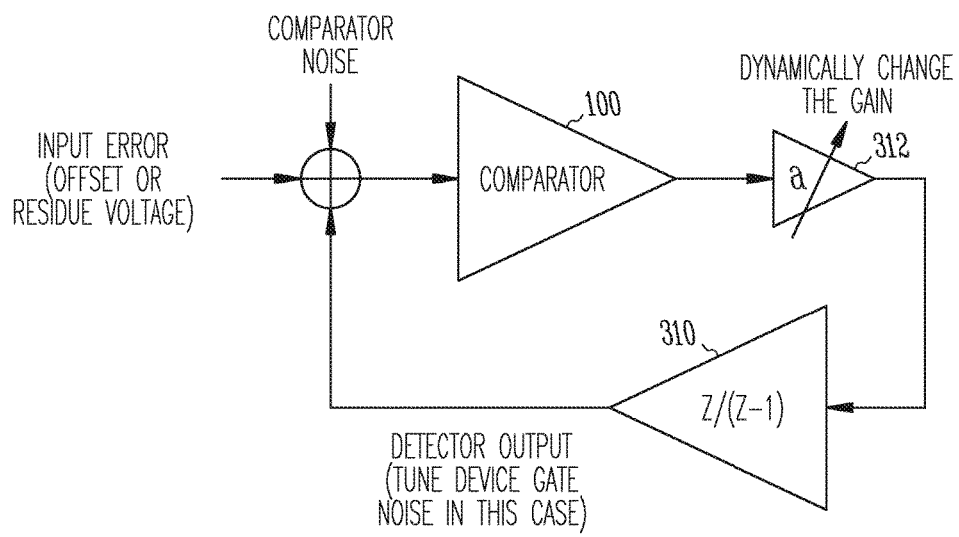
FIG. 7A shows a simplified block diagram showing portions of the control loop using the error detector circuit such as explained above, but including an illustrative example of using dynamic (time-varying) gain "a".
Figure 7B:
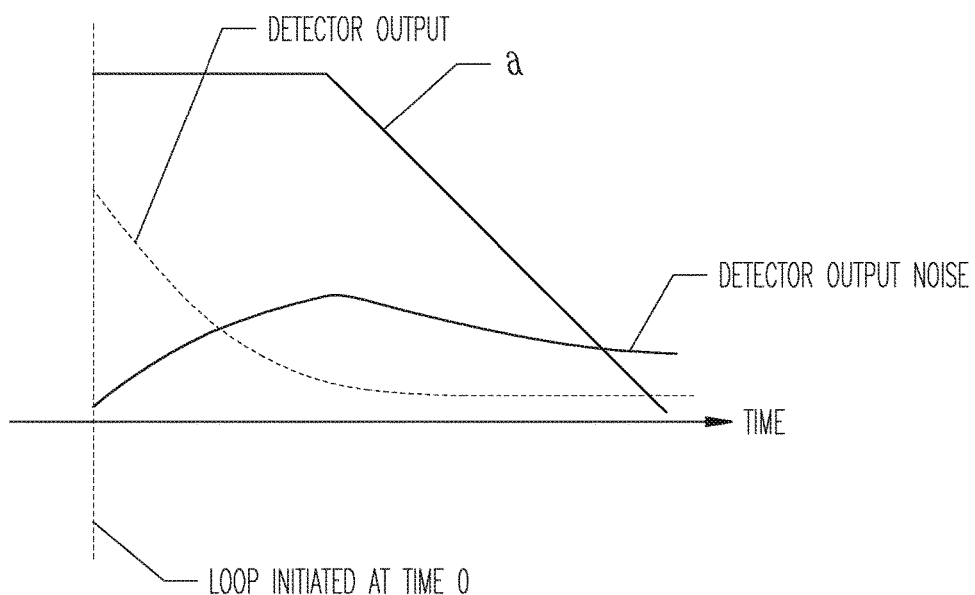
FIG. 7B shows a conceptualized graph of signal voltage vs. time, corresponding to the block diagram of FIG. 7A, during an auto-zero phase initiated at time t=0, with an illustrative example of a dynamic, time-varying gain "a" superimposed onto the time graph.

FIG. 7A shows a simplified block diagram, similar to that shown in FIG. 6A, but in which a dynamic gain stage 312 is used, with a higher initial gain value during an initial portion of the auto-zero phase, followed by a decreased or decreasing value of gain thereafter. FIG. 7B shows a corresponding conceptualized graph of signal voltage vs. time during an auto-zero phase as the multiple comparator output values of the comparator 100 are provided to the error detector circuit 302, after the auto-zero phase control loop has been initiated at time t=0 and while the auto-zero phase control loop such as shown in FIG. 7A is active. Superimposed onto FIG. 7B is a representation of an illustrative example of the dynamic gain, which at the beginning of the auto-zero phase is a fixed-value "a", which is then decreased, for example, as a function of time in a manner that can help improve or optimize the noise performance by limiting the amount of the error detector output noise that is accumulated by the error detector feedback loop during the auto-zero phase of operation. The exact function of time in which the gain varies need not be linearly decreasing such as shown in the illustrative example of FIG. 7B, but can be established in any desired manner to improve or optimize the noise performance. An illustrative, non-limiting example of a step-wise time-varying gain is shown below in Table 1. Also, the dynamically time-varying gain can be provided by the filter 310, rather than by a separate gain stage 312, as shown. Using a higher gain during an initial portion of the auto-zero phase during which the error compensation feedback loop is operating can help improve the settling time of the loop. Then lowering the gain during a later portion of the auto-zero phase can help improve the accuracy of the error compensation.

TABLE 1

Example of Gain "a" vs. Comparator Iteration

| Comparator Iteration | Gain |
|---|---|
| 1 | 4 |
| 2 | 2 |
| 3 | 1 |
| 4 | 0.7 |
| 5 | 0.7 |
| 6 | 0.5 |
| 7 | 0.5 |
| 8 | 0.5 |
| 9 | 0.5 |
| 10 | 0.35 |
| 11 | 0.35 |
| 12 | 0.35 |
| 13 | 0.35 |
| 14 | 0.35 |
| 15 | 0.35 |
| 16 | 0.35 |
| 17 | 0.35 |

The above examples have focused on implementations in which separate DACs (DAC1 406 and DAC2 410) are used for bit-trials (DAC1 406) and for comparator input noise and offset compensation (DAC2 410). However, it is also possible to combine these DACs such that the DAC2 410 can also be used for bit-trials. For example, after the most significant bit (MSB) bit trials are performed by the DAC1 406 in an ADC, the residue can undergo ADC by the DAC2 410, which is also used for comparator input noise and offset compensation. In an illustrative example, in which MSB bit trials are performed by the DAC1 406 in an ADC, and in which the residue undergoes ADC by the DAC2 410, using iterative bit trials with a corresponding varying gain "a" such as shown in Table 1, comparator noise can be reduced by 9.9 dB, according to a computer simulation performed using a behavioral model.

Figure 8A:
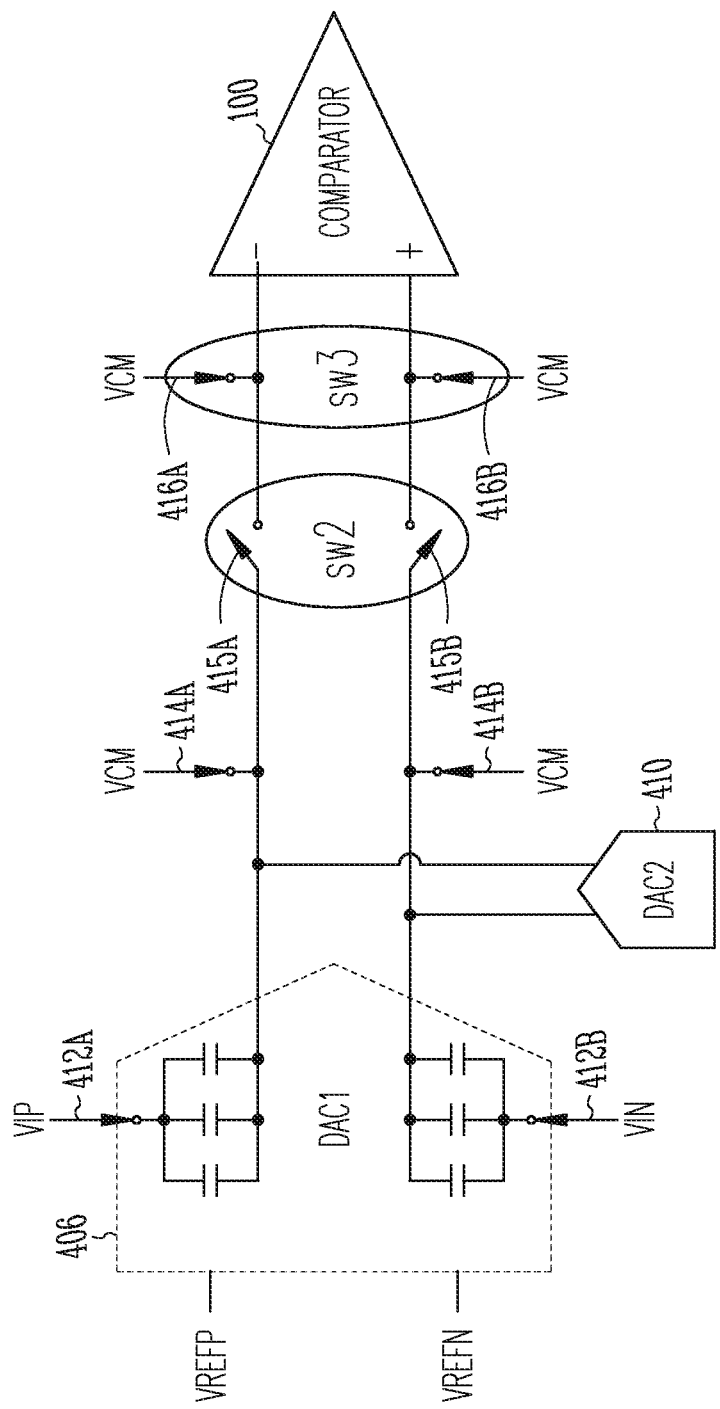
FIGS. 8A, 8B, and 8C illustrate portions of an ADC conversion system with various examples of how a second DAC can be coupled to a first DAC and a comparator during a signal acquisition phase.
Figure 8B:
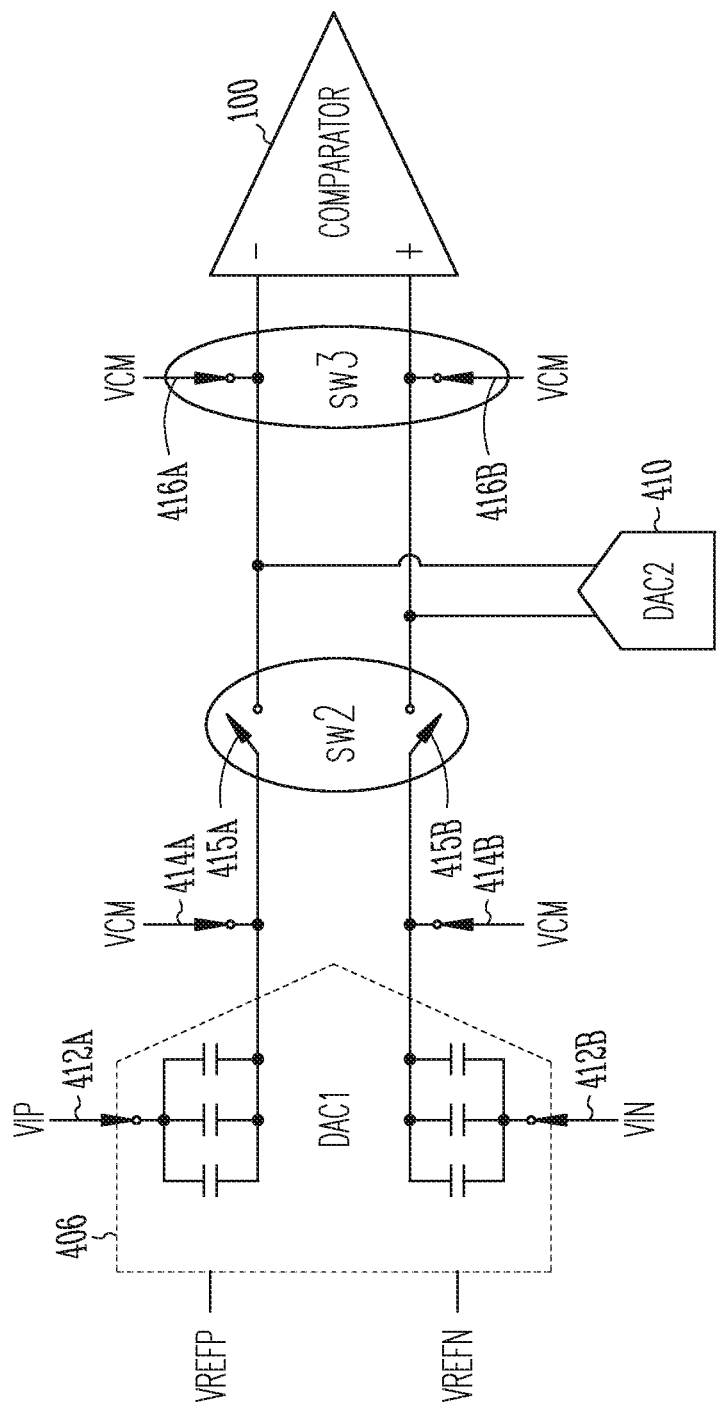
Figure 8C:
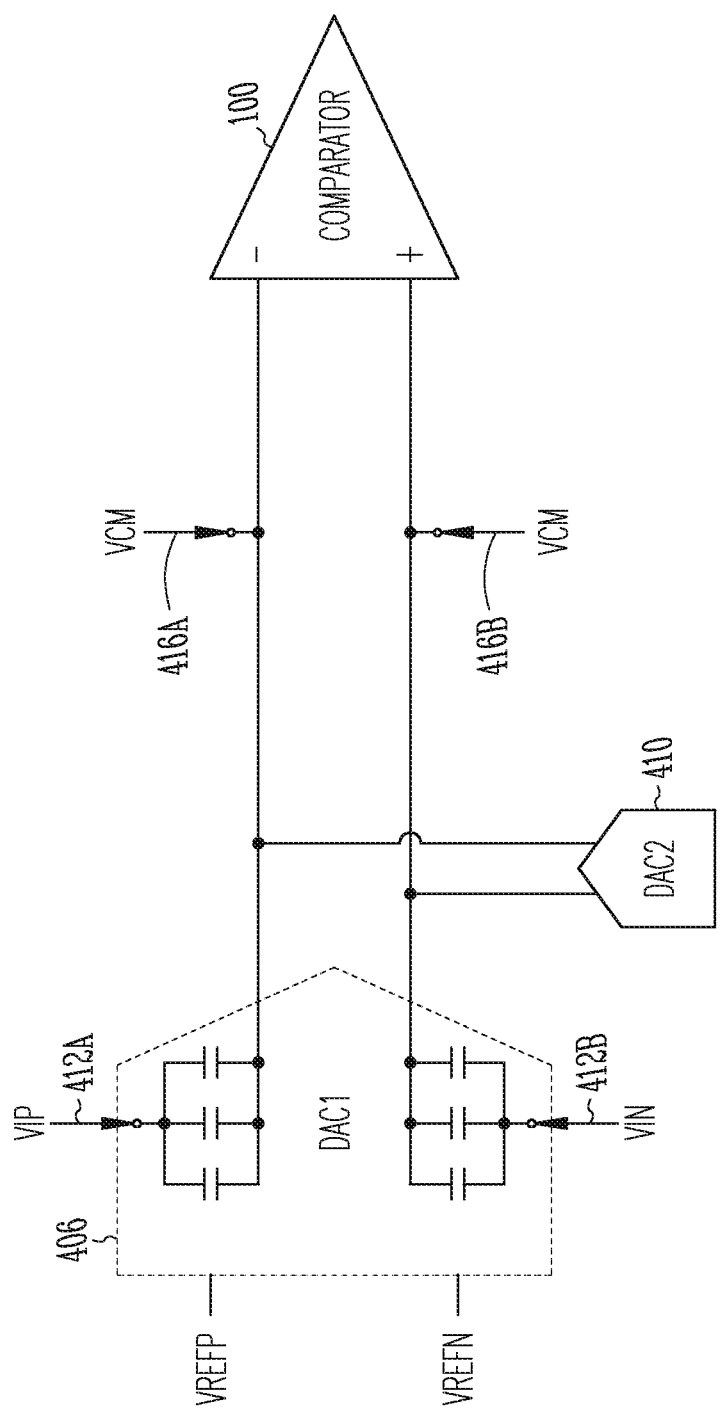

FIGS. 8A, 8B, and 8C illustrate portions of an ADC conversion system with various examples of how the DAC2 410 can be coupled to DAC1 406 and the comparator 100 during a signal acquisition phase. In the examples of FIGS. 8A and 8C, during this signal acquisition phase, the input signal at "vip" and "vin" can be coupled onto both the DAC1 406 and DAC2 410, such as by closing the switches 412A-B. In the alternative example of FIG. 8B, during this signal acquisition phase, the input signal at "vip" and "yin" can be coupled onto DAC1 406, such as by closing the switches 412A-B, but not onto DAC2 410, by holding the switches 415A-B open and the switches 414A-B and 416A-B closed.

Figure 9:
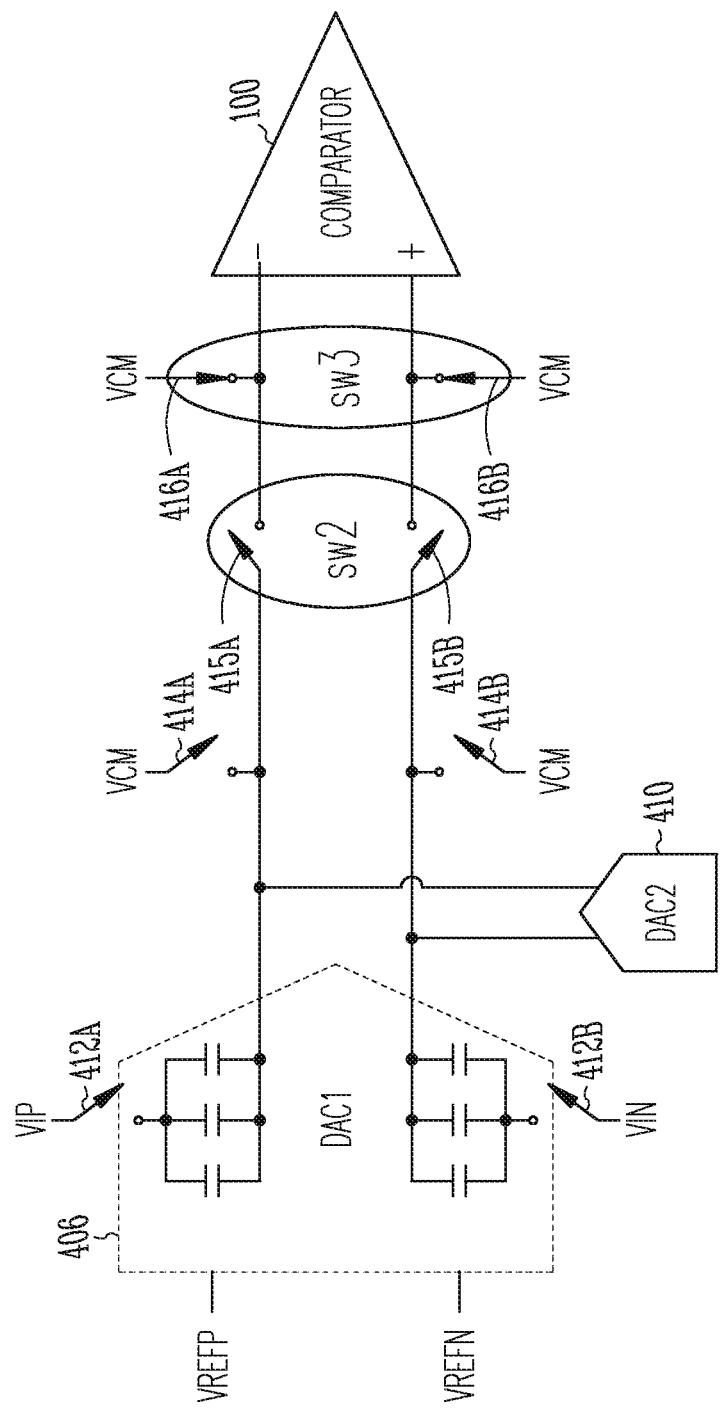
FIG. 9 shows the example of FIG. 8A after the signal acquisition phase, when the input signal has been sampled onto the DAC1 and the DAC2, and during an auto-zeroing phase of the comparator.

FIG. 9 shows the example of FIG. 8A after the signal acquisition phase, when the input signal has been sampled onto the DAC1 406 and the DAC2 410, and during an auto-zeroing phase of the comparator 100.

Figure 10:
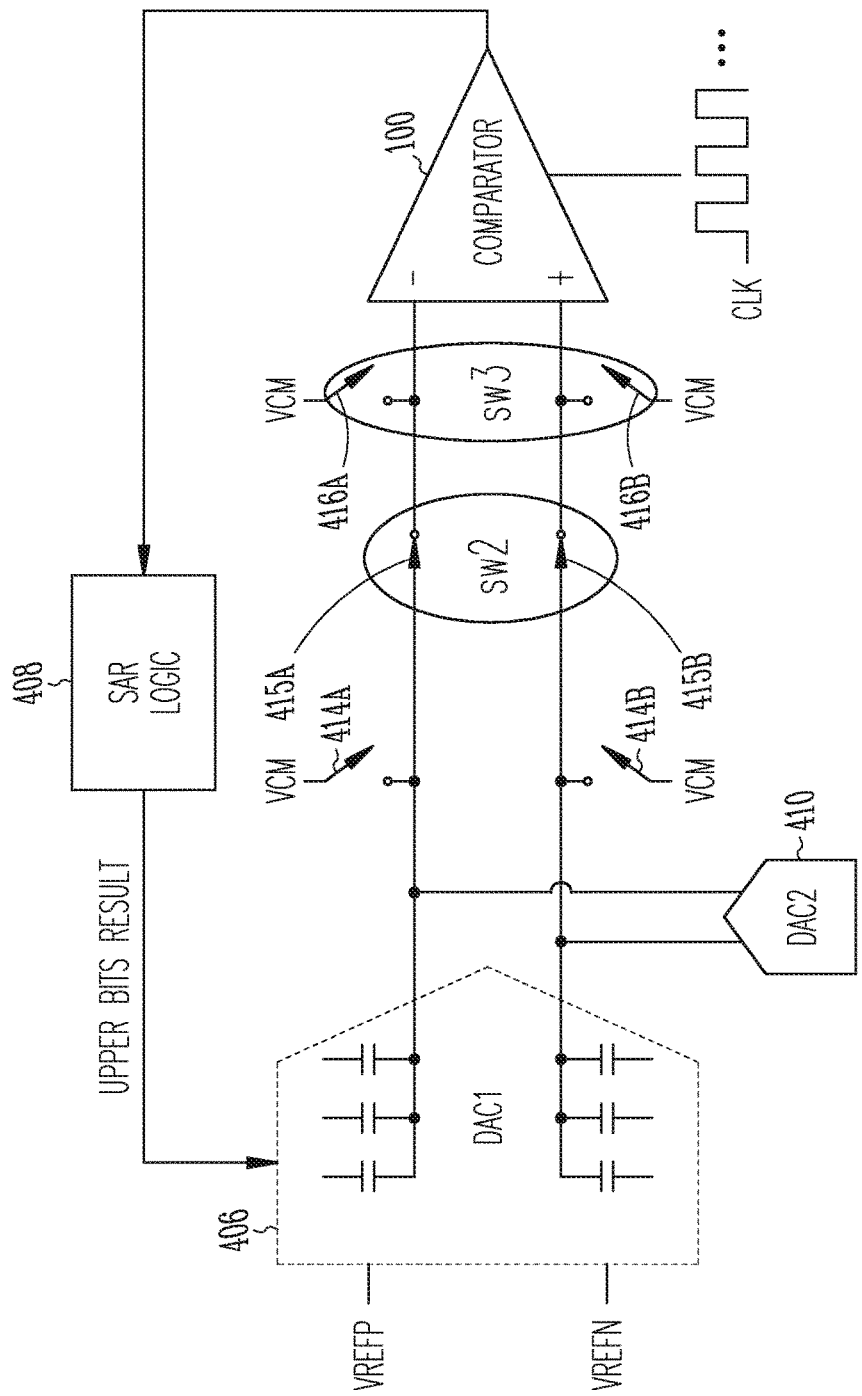
FIG. 10 shows the example of FIG. 8A after the autozeroing phase and during a following bit trial or bit decision phase in which the upper bits of the ADC are determined using a SAR ADC conversion.

FIG. 10 shows the example of FIG. 8A after the autozeroing phase of the comparator 100 and during a following bit trial or bit decision phase in which the upper bits of the ADC are determined using a SAR ADC conversion using SAR logic 408 operating according to a typical SAR process for ADC of MSBs associated with the DAC1 406.

Figure 11:
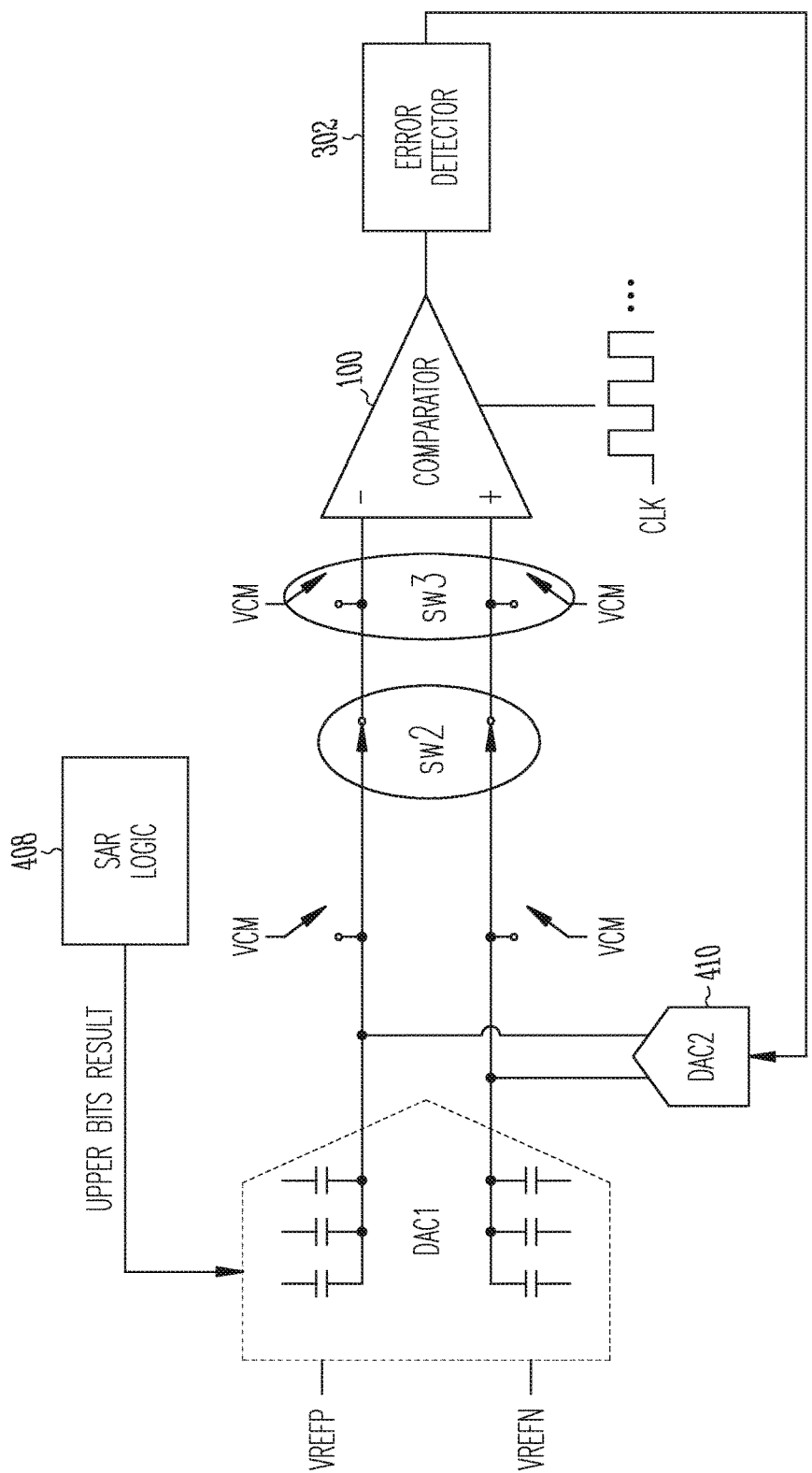
FIG. 11 shows the example of FIG. 8A after the bit trial or bit decision phase of FIG. 10, and during a residue error reduction phase in which lower bits of the ADC are determined using a SAR ADC conversion with the error detector circuit operating in the loop with the DAC2 for residue reducing bit trials or bit decisions, rather than during autozeroing.

FIG. 11 shows the example of FIG. 8A after the bit trial or bit decision phase of FIG. 10, and during a residue error reduction phase. During this residue error reduction phase, the DAC2 410 can be operated using the error detector 302 circuit, with its gain and IIR or FIR filter or, in an example, with its dynamic time-varying gain and IIR or FIR filter, such as explained above. However, in this example, during this residue reduction phase, no auto-zeroing of the comparator 100 is being performed. Instead, the switches 414A-B and 416A-B are being held open to allow ADC of the residue (left by the ADC of the MSBs by the DAC1 406) by the DAC2 410. In this case, the resulting code provided by the error detector 302 circuit to the DAC2 410 can also represent the LSBs of the ADC that was performed by the DAC1 406 and the DAC2 410.

FIG. 12 shows a more detailed example of a comparator 100 that can include tunable noise or offset compensation inputs 203A, 203B, such as $v_{tune}+$, $v_{tune}-$, as well as comparator signal inputs v+ and v−. In this example, the comparator signal inputs can be used to drive differential transistor pair inputs of an input differential pair stage, which can use a resistive or other loads for producing signals that can drive a differential transistor pair inputs of a high-gain output stage, such as can use one or more cross-coupled loads. The noise or compensation inputs 203A-B can be applied to differential transistor pair inputs of an intermediate offset or noise compensation stage, such as to steer a tail current through a desired leg of the input differential pair stage, such as to produce a desired compensatory offset voltage across the resistive loads of the input differential pair stage.

VARIOUS NOTES

The above description includes references to the accompanying drawings, which form a part of the detailed description. The drawings show, by way of illustration, specific embodiments in which the invention can be practiced. These embodiments are also referred to herein as "examples" or "aspects." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein. A non-limiting numbered list of aspects or examples follows.

Aspect 1 can include or use subject matter (e.g., a system, a device, a method of use, a machine-readable medium including instructions for performing a method, or the like) such as a system including circuitry for making a comparison capable of compensating for at least one of noise or offset. The system can include a comparator circuit. The comparator circuit can include a comparator output and at least first and second comparator inputs. The system can include an error detector circuit. The error detector input can be coupled to the comparator output. An error detector output can be coupled to an input of the comparator circuit. The error detector circuit can include a filter circuit. The filter circuit can have a time varying filter response, such as can be responsive to multiple signal values of the comparator output, such as can be used to adjust a signal value provided to the comparator circuit.

In Aspect 2, the subject matter of Aspect 1 can include or use the first and second comparator inputs of the comparator circuit being coupled to the same voltage during an auto-zero mode. The filter circuit can be responsive to multiple signal values of the comparator output during the auto zero mode, such as to adjust a compensation signal value that can be provided to the comparator circuit, such as to compensate for at least one of noise or offset.

In Aspect 3, the subject matter of any of Aspects 1-2 can include or use the error detector circuit optionally having an accumulator circuit. The accumulator circuit can include an input that can be coupled to the comparator output.

In Aspect 4, the subject matter of any of Aspects 1-3 can include or use the error detector circuit optionally including a quantizer circuit. The quantizer circuit can include an input that can be coupled to the comparator output.

In Aspect 5, the subject matter of any of Aspects 1-4 can include or use the error detector circuit optionally including an integrator circuit. The integrator circuit can include an input that can becoupled to an output of the comparator circuit, and can include an output that can be coupled to a comparator compensation input of the comparator circuit such as to decrease an offset voltage effect of the comparator circuit such as based on multiple signal values of the comparator output such as can be provided during the auto-zero mode.

In Aspect 6, the subject matter of any of Aspects 1-5 can include or use the error detector circuit optionally including an accumulator circuit, a quantizer circuit, and an integrator circuit. The accumulator circuit can include an input that can be coupled to the comparator output. The quantizer circuit can include an input that can be coupled to an output of the accumulator circuit. The integrator circuit can include an input that can be coupled to an output of the quantizer circuit. The integrator circuit can include an output that can be coupled to a comparator compensation input of the comparator circuit such as to decrease an offset voltage effect of the comparator circuit such as based on multiple signal values of the comparator output such as can be provided during the auto-zero mode.

In Aspect 7, the subject matter of any of Aspects 1-6 can include or use the error detector circuit optionally including a filter circuit that can include a digital filter circuit.

In Aspect 8, the subject matter of any of Aspects 1-7 can include or use a digital filter circuit that can include an infinite impulse response (IIR) filter circuit.

In Aspect 9, the subject matter of any of Aspects 1-8 can include or use a digital filter circuit that can include a time-varying gain, such as can decrease from an initial gain value during the auto-zero mode.

In Aspect 10, the subject matter of any of Aspects 1-9 can include or use the error detector circuit optionally including an accumulator circuit.

In Aspect 11, the subject matter of any of Aspects 1-10 can include or use an accumulator circuit that can include an averager circuit.

In Aspect 12, the subject matter of any of Aspects 1-11 can include or use an averager circuit that can include or use a sinc 0 filter circuit.

In Aspect 13, the subject matter of any of Aspects 1-12 can include or use the error detector circuit including or being coupled to a digital-to-analog converter (DAC) circuit that can be coupled to the comparator such as to compensate the comparator.

In Aspect 14, the subject matter of any of Aspects 1-13 can include or use an analog-to-digital converter (ADC) circuit such as can include a DAC such as can be used for bit decisions in the ADC circuit such as when the comparator is not in the auto-zero mode.

In Aspect 15, the subject matter of any of Aspects 1-14 can include or use the error detector circuit including a time-varying gain that can decrease from an initial gain value during the auto-zero mode.

In Aspect 16, the subject matter of any of Aspects 1-15 can include or use a first digital-to-analog converter (DAC) circuit that can be coupled to the first and second comparator inputs such as during a bit decision process. A second. DAC circuit can be coupled to the first and second comparator inputs such as during the bit decision process. The error detector circuit can control an input code to the second DAC circuit such as during the bit decision process.

In Aspect 17, the subject matter of any of Aspects 1-16 can include or use the error detector circuit controlling the input code to the second DAC circuit such as during the bit decision process operating upon a residue from the first DAC bit decision process, such as in a manner that permits re-deciding one or more of the bit decisions of the bit decision process of the second DAC circuit operating upon the residue from the first DAC bit decision process.

In Aspect 18, the subject matter of any of Aspects 1-17 can include or use an analog-to-digital conversion value being based on the bit decision process using both the first and second DAC circuits.

In Aspect 19, the subject matter of any of Aspects 1-18 can include or use a filter circuit that can include a recursive filter circuit, such as having a time-varying filter response.

In Aspect 20, the subject matter of any of Aspects 1-19 can include or use a recursive filter circuit that can include a digital infinite impulse response (IIR) filter circuit.

In Aspect 21, the subject matter of any of Aspects 1-20 can include or use an IIR filter circuit that can include the time-varying filter response including a dynamic gain that can be adapted to vary such as over at least two of the multiple signal values of the comparator output.

Aspect 22 can include or use subject matter (e.g., a system, a device, a method of use, a machine-readable medium including instructions for performing a method, or the like), or can be combined with the subject matter of any of Aspects 1-21, such as to include an analog-to-digital converter (ADC) system. The ADC system can include a comparator circuit. The comparator circuit can include a comparator output and first and second comparator inputs and at least one comparator compensation input. The ADC can include a bit decision digital-to-analog converter (DAC) circuit. The ADC can include a comparator compensation digital-to-analog converter (DAC) circuit. The ADC can include an error detector circuit. The error detector input can be selectively coupled to the comparator output. An error detector output can be selectively coupled such as via the bit decision DAC circuit to the first and second comparator inputs and such as via the comparator compensation DAC to at least one comparator compensation input. The error detector circuit can include a digital filter circuit and can have a time-varying gain such as to apply a decreasing gain to later successive approximation bit decisions of a particular input signal value that are performed using the bit decision DAC.

In Aspect 23, the subject matter of any of Aspects 1-22 can include or use the at least one comparator compensation input that can include first and second comparator inputs of the comparator circuit that can be coupled to the same voltage during an auto-zero mode. The error detector circuit can include the filter circuit being responsive to multiple signal values of the comparator output during the auto zero mode such as to adjust a compensation signal value provided to the first and second compensation inputs of the comparator circuit to compensate for at least one of noise or offset.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A system including circuitry for making a comparison capable of compensating for at least one of noise or offset, the system comprising:
   a comparator circuit, including a comparator output and at least first and second comparator inputs; and
   an error detector circuit, including an error detector input coupled to the comparator output, and an error detector output coupled to an input of the comparator circuit, wherein the error detector circuit includes a filter circuit, having a time varying filter response, responsive to multiple signal values of the comparator output to adjust a signal value provided to the comparator circuit, the time-varying filter response including a time-varying gain that decreases, during an auto-zero phase or a bit-trial or other comparison phase, from an initial gain value to limit noise during, that phase.

2. The system of claim 1, in which the first and second comparator inputs of the comparator circuit are coupled to the same voltage during an auto-zero mode, and wherein the filter circuit is responsive to multiple signal values of the comparator output during the auto zero mode to adjust a compensation signal value provided to the comparator circuit to compensate for at least one of noise or offset.

3. The system of claim 2, in which the error detector circuit includes:
   an accumulator circuit, including an input coupled to the comparator output.

4. The system of claim 2, in which the error detector circuit includes:
   a quantizer circuit, including an input coupled to the comparator output.

5. The system of claim 2, in which the error detector circuit includes:
   an integrator circuit, including an input coupled to an output of the comparator circuit, and including an output coupled to a comparator compensation input of the comparator circuit to decrease an offset voltage effect of the comparator circuit based on multiple signal values of the comparator output provided during the auto-zero mode.

6. The system of claim 2, in which the error detector circuit includes:
   an accumulator circuit, including an input coupled to the comparator output;
   a quantizer circuit, including an input coupled to an output of the accumulator circuit; and
   an integrator circuit, including an input coupled to an output of the quantizer circuit, and including an output coupled to a comparator compensation input of the comparator circuit to decrease an offset voltage effect of the comparator circuit based on multiple signal values of the comparator output provided during the auto-zero mode.

7. The system of claim 1, wherein the error detector circuit includes the filter circuit including a digital filter circuit.

8. The system of claim 7, wherein the digital filter circuit includes an infinite impulse response (IIR) filter circuit.

9. The system of claim 8, wherein the digital filter circuit includes a time-varying gain that decreases from an initial gain value during the auto-zero mode.

10. The system of claim 1, wherein the error detector circuit includes an accumulator circuit.

11. The system of claim 10, wherein the accumulator circuit includes an averager circuit.

12. The system of claim 11, wherein the averager circuit includes a sinc 0 filter circuit.

13. The system of claim 1, wherein the error detector circuit includes or is coupled to a digital-to-analog converter (DAC) circuit that is coupled to the comparator to compensate the comparator.

14. The system of claim 1, including an analog-to-digital converter (ADC) circuit including a DAC that is used for bit decisions in the ADC circuit when the comparator is not in the auto-zero mode.

15. The system of claim 1, wherein the error detector circuit includes a time-varying gain that decreases from an initial gain value during the auto-zero mode.

16. The system of claim 1, comprising:
   a first digital-to-analog converter (DAC) circuit coupled to the first and second comparator inputs during a bit decision process; and
   a second DAC circuit coupled to the first and second comparator inputs during the bit decision process; and
   wherein the error detector circuit controls an input code to the second DAC circuit during the bit decision process.

17. The system of claim 16, wherein the error detector circuit controls the input code to the second DAC circuit during the bit decision process operating upon a residue from the first DAC bit decision process in a manner that permits re-deciding one or more of the bit decisions of the bit decision process of the second DAC circuit operating upon the residue from the first DAC bit decision process.

18. The system of claim 16, wherein an analog-to-digital conversion value is based on the bit decision process using both the first and second DAC circuits.

19. The system of claim 16, wherein the filter circuit includes a recursive filter circuit, having a time-varying filter response.

20. The system of claim 19, wherein the recursive filter circuit includes a digital infinite impulse response (IIR) filter circuit.

21. The system of claim 20, wherein the IIR filter circuit includes the time-varying filter response including a dynamic gain adapted to vary over at least two of the multiple signal values of the comparator output.

22. An analog-to-digital converter (ADC) system, comprising:
- a comparator circuit, including a comparator output and first and second comparator inputs and at least one comparator compensation input;
- a bit decision digital-to-analog converter (DAC) circuit;
- a comparator compensation digital-to-analog converter (DAC) circuit; and
- an error detector circuit, including an error detector input selectively coupled to the comparator output, and an error detector output selectively coupled via the bit decision DAC circuit to the first and second comparator inputs and via the comparator compensation DAC to at least one comparator compensation input, wherein the error detector circuit includes a digital filter circuit and has a time-varying gain to apply a decreasing gain to later successive approximation bit decisions of a particular input signal value that are performed using the bit decision DAC.

23. The system of claim 22, wherein the at least one comparator compensation input includes first and second comparator inputs of the comparator circuit that are coupled to the same voltage during an auto-zero mode, and wherein the error detector circuit comprises the filter circuit being responsive to multiple signal values of the comparator output during the auto zero mode to adjust a compensation signal value provided to the first and second compensation inputs of the comparator circuit to compensate for at least one of noise or offset.

24. A method of using circuitry, including a comparator circuit and an error detector circuit, for making a comparison capable of compensating for at least one of noise or offset, the method comprising
- coupling the error detector to an output of the comparator output to provide a time varying filter response, responsive to multiple signal values of the comparator output to adjust a signal value provided to the comparator; and
- wherein providing the time-varying filter response includes providing a time-varying gain that decreases, during an auto-zero phase or a bit-trial or other comparison phase, from an initial gain value to limit noise during that phase.

25. The method of claim 24, comprising integrating an output of the comparator to generate a compensation signal for the comparator to decrease an offset voltage effect of the comparator based on multiple signal values of the comparator output provided during the auto-zero mode.

26. The method of claim 24, comprising using the comparator for successive approximation bit decisions in an analog-to-digital conversion.

27. The method of claim 26, wherein the time-varying filter response has a time-varying gain to apply a decreasing gain to later successive approximation bit decisions of a particular input signal value.

28. The method of claim 24, wherein the time-varying filter response includes a dynamic gain adapted to vary over at least two of the multiple signal values of the comparator output.

\* \* \* \* \*